(12) United States Patent
Muegge et al.

(10) Patent No.: US 12,276,389 B2
(45) Date of Patent: Apr. 15, 2025

(54) ILLUMINATION DEVICE FOR A MOTOR VEHICLE

(71) Applicant: HELLA GmbH & Co. KGaA, Lippstadt (DE)

(72) Inventors: Martin Muegge, Geseke (DE); Diana Mundt, Lippstadt (DE); Thomas Rettweiler, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 18/665,469

(22) Filed: May 15, 2024

(65) Prior Publication Data

US 2024/0302015 A1    Sep. 12, 2024

Related U.S. Application Data

(63) Continuation of application No. PCT/EP2022/080227, filed on Oct. 28, 2022.

(30) Foreign Application Priority Data

Nov. 15, 2021  (DE) ...................... 10 2021 129 668.4

(51) Int. Cl.
*F21S 41/40* (2018.01)
*F21S 41/143* (2018.01)
(Continued)

(52) U.S. Cl.
CPC ............. *F21S 41/40* (2018.01); *F21S 41/143* (2018.01); *F21S 41/153* (2018.01); *F21S 41/36* (2018.01);
(Continued)

(58) Field of Classification Search
CPC .......... F21S 41/40; F21S 41/663; F21S 41/36; F21S 41/14; F21S 41/143; F21S 41/153;
(Continued)

(56) References Cited

U.S. PATENT DOCUMENTS

| 8,807,809 B2 | 8/2014 | Kloos |
| 9,656,598 B1 | 5/2017 | Salter et al. |

(Continued)

FOREIGN PATENT DOCUMENTS

| DE | 19738972 A1 | 2/1999 |
| DE | 102011054234 A1 | 4/2013 |

(Continued)

OTHER PUBLICATIONS

International Search Report dated Feb. 7, 2023 in corresponding application PCT/EP2022/080227.

*Primary Examiner* — Christopher E Dunay
(74) *Attorney, Agent, or Firm* — Muncy, Geissler, Olds & Lowe, P.C.

(57) ABSTRACT

An illumination device for a motor vehicle having a printed circuit board with a plurality of light emitting diodes disposed thereon. An optical pane and a reflector element are provided, whereby the reflector element is disposed between the printed circuit board and the optical pane. The reflector element has a plurality of segments into which the reflector element is divided. Each light emitting diode is assigned a segment so that light emitted from the light emitting diodes is reflected by the segments of the reflector element and passes through the optical pane.

15 Claims, 14 Drawing Sheets

(51) Int. Cl.
- *F21S 41/153* (2018.01)
- *F21S 41/36* (2018.01)
- *F21S 41/663* (2018.01)
- *F21S 43/00* (2018.01)
- *F21S 43/14* (2018.01)
- *F21S 43/15* (2018.01)
- *F21S 43/20* (2018.01)
- *F21S 43/31* (2018.01)

(52) U.S. Cl.
CPC ............ *F21S 41/663* (2018.01); *F21S 43/14* (2018.01); *F21S 43/15* (2018.01); *F21S 43/265* (2024.05); *F21S 43/31* (2018.01); *F21S 43/601* (2024.05)

(58) Field of Classification Search
CPC .. F21S 43/14; F21S 43/31; F21S 43/15; F21S 43/265; F21S 43/601
See application file for complete search history.

(56) References Cited

U.S. PATENT DOCUMENTS

| | | | |
|---|---|---|---|
| 11,408,592 B2* | 8/2022 | Owens | F21V 11/183 |
| 11,940,118 B2 | 3/2024 | Michaelis et al. | |
| 2005/0138852 A1 | 6/2005 | Yamauchi | |
| 2010/0033956 A1* | 2/2010 | Kirchberger | G09F 13/14 |
| | | | 362/235 |
| 2010/0091507 A1* | 4/2010 | Li | F21V 7/048 |
| | | | 362/241 |
| 2020/0150333 A1* | 5/2020 | Vasylyev | G02B 6/0055 |
| 2020/0263854 A1* | 8/2020 | Booij | F21V 7/04 |

FOREIGN PATENT DOCUMENTS

| | | | | |
|---|---|---|---|---|
| DE | 102017103421 A1 | | 8/2017 | |
| DE | 102016119326 A1 | * | 4/2018 | .......... B60Q 1/0041 |
| DE | 102020107728 A1 | | 9/2021 | |
| JP | 2002245813 A | | 8/2002 | |

* cited by examiner

ILLUMINATION DEVICE FOR A MOTOR VEHICLE

This nonprovisional application is a continuation of International Application No. PCT/EP2022/080227, which was filed on Oct. 28, 2022, and which claims priority to German Patent Application No. 10 2021 129 668.4, which was filed in Germany on Nov. 15, 2021, and which are both herein incorporated by reference.

BACKGROUND OF THE INVENTION

Field of the Invention

The present invention relates to an illumination device for a motor vehicle, an illumination system and a motor vehicle.

Description of the Background Art

The design of a pixelated or segmented functional surface of a luminaire or illumination device on a motor vehicle serves to define and provide a desired illumination signature by means of different, individual switching of individual segments/pixels or to provide additional information content (e.g., numbers, text, pictograms). This means that new components or light signatures can be developed over the course of the vehicle's useful life and offered to the vehicle owner/driver without having to develop a new luminaire each time.

An illumination device is known from DE 10 2016 119 326 A1, which is incorporated herein by reference.

From the general state of the art, LED displays with a matrix arrangement of RGB LEDs are known, which are mainly known from advertising or as video walls at trade fairs and concerts. The RGB LEDs are very low in luminous flux, which is why these LED displays cannot achieve the light intensity with the correspondingly limited number of LEDs legally required in the automotive sector. In addition, such LED displays are controlled via video interfaces, e.g., HDMI, which are not used in automobiles, as such video signals are not suitable for controlling luminaires and functions. Another disadvantage of these LED panels is the pixelated arrangement of light emitting diodes in a matrix. The viewer sees a bright spot at each LED point and only due to the very narrow distances and a correspondingly high resolution is a viewer able to see a sharp image even from close viewing distances. For this reason, light emitting diodes with distances of less than 2 mm are currently already provided or distances of 1 mm or less are desired in such LED panels.

In order to produce the legally required minimum light intensities of 4 cd for a red tail light, of 50 cd (EGE) or 130 cd (SAE) for a yellow direction indicator and of 60 cd (EGE) or 80 cd (SAE) for a red brake light, LEDs with higher operating currents and luminous fluxes, as well as an automotive specification, must be used and optical systems that make optimum use of the luminous flux of the LED, so that even with a small number of pixels/segments, a brake light or a direction indicator can be generated and correspondingly different light signatures can be developed and approved with the existing segmented matrix display area.

SUMMARY OF THE INVENTION

It is therefore an object of the present invention to provide an illumination device improved over the state of the art, in particular one with a simple and cost-effective delimitation of adjacent light emitting diodes and a uniform illumination of the illumination device with a particularly compact design, especially with a low luminaire thickness or depth.

According to a first aspect of the invention, the above object is achieved by an illumination device for a motor vehicle, wherein the illumination device is set up in particular for light signature displays or for displaying light signatures. The illumination device has a printed circuit board having a plurality of light emitting diodes arranged thereon, an optical pane and a reflector element. The reflector element is arranged between the printed circuit board and the optical pane. The reflector element has a plurality of segments into which the reflector element is divided, with each light emitting diode being assigned a segment, so that light emitted from the light emitting diodes is reflected by the segments of the reflector element and passes through the optical pane. The light emitting diodes are radial-beam light emitting diodes.

According to the invention, the use of radial-beam light emitting diodes is proposed, which emit light from the light emitting diode radially instead of emitting light from a main surface or front in a forward direction, as is usually the case. This is because such light emitting diodes, which radiate in the forward direction instead of radially, which are also known as TOP-LEDs, provide bright light spots axially in front of the TOP-LED and on the optical pane, which according to the invention can be avoided by the use of radial-beam light emitting diodes.

Despite the radial emission of the light emitted by the light emitting diodes, the reflector element deflects the light emitted by the radial-beam light emitting diodes in the forward direction, i.e., onto the optical pane. Accordingly, the reflector element can be specially designed to deflect the radial light emitted by each of the light emitting diodes in the forward direction towards the optical pane. As a result, a particularly uniform illumination of each area of a segment or of the optical pane in the area of the segments can be achieved, so that a uniform illumination of each area of the optical pane or segment can be achieved.

Another advantage of the light emitting diodes of the radial-beam type used is that the path of the light to the reflector element or the wall elements there is comparatively short. As a result, it is overall possible to provide a comparatively compact illumination device for a motor vehicle. In particular, the illumination device can be designed with a comparatively low thickness, especially when measured from the printed circuit board to the optical pane.

The illumination device being designed for a motor vehicle means, for example, that the illumination device is suitable for use in a motor vehicle. Nevertheless, other areas of application of the inventive illumination device are also conceivable and possible. However, the motor vehicle is the particularly preferred area of application. Thus, the illumination device can be a motor vehicle illumination device in particular. For example, the illumination device may be a rear light, an auxiliary light, a headlight or the like.

The radial-beam light emitting diodes may be designed to radiate light radially outwards at or from their circumference. At least not only, or not predominantly, light can also be emitted from the front of each of the light emitting diodes, as is the case with a TOP-LED, for example. However, it is crucial that light is also (in particular mostly) emitted radially or ring-shaped from the circumference of the light emitting diodes. The circumference of a light emitting diode is understood to mean the sides of the light emitting diode, which typically extend obliquely to the front, especially orthogonally. In other words, the circumference with its side or sides is between the front and back of the light emitting diode.

In particular, radial light-emitting diodes may be designed to radiate light radially outwards over at least half of their circumference or substantially along their entire circumference. In other words, light may be emitted radially outwards along at least half, predominantly, or substantially all of the circumference, or, in other words, it may be emitted in a ring from each of the light emitting diodes.

Instead of or in addition to the use of radial-beam light emitting diodes, it is possible for each segment to be assigned a concave lens, which can be arranged in each case between the reflector element and the optical pane. In particular, the lenses can be arranged, in particular molded, on the optical pane, in particular on the inner side of the optical pane or the side opposite the reflector element. In particular, the assignment means that in each case one lens is arranged opposite each segment. In particular, the lenses can be formed in one piece with the optical pane. It is also possible that the lenses have a triangular or essentially triangular shape in order to correspond to the segments. On the one hand, a concave, central surface of the lenses can be at a greater distance (several millimeters) from the respective light emitting diode assigned it by means of the segment. In contrast, due to their design, especially as pyramidal optics, the lenses can have a larger wall thickness on their exterior. This is advantageous for a uniform illumination without an emphasis on axial light emitting diode intensity (especially with so-called TOP-LEDs), allowing for illumination of the segment or the area of the optical pane in front of the segment without hotspots. At the same time, the optical pane also contains a light guide effect and, in the interaction of the prism surfaces of the lens and the surrounding reflector surfaces of the segments of the reflector element, also an additional light guide, which, together with the central illumination of the concave lens surface leads to a homogeneous illumination of the segment or the area of the optical pane in front of the segment, thus providing high performance.

The design of the optical pane with the concave lenses and/or the choice of radial-beam light emitting diodes in combination with the light emitting diode light distribution and the reflector element leads to a uniform illumination of the segments or segment surfaces of the reflector element and thus of the optical pane. This provides a segment display function and at the same time a high photometric performance, as almost all of the light from the respective light emitting diodes is used. This way, the illumination device is already able to provide high intensities even with relatively weak light emitting diodes and to implement functions such as tail light, brake light, direction indicator or daytime running lights, especially when several illumination devices are used as part of an illumination system to switch a continuous or common light signature.

It may also be provided that each light emitting diode is assigned a segment in such a way that light emitted from each light emitting diode is reflected by the reflector element and passes through the optical pane in the area of the segment assigned this light emitting diode. The assignment of the segments to the light emitting diodes can be done by a corresponding relative arrangement to each other. For example, each segment of a reflector element can surround a light emitting diode on the printed circuit board, in particular enveloping or enclosing it. This causes the light of the respective light emitting diode to reflect on the reflector element in the area of the respective segment.

In addition, it may be provided that a distance between the light emitting diodes and the optical pane is less than 15 mm, preferably less than 12 mm, further preferably less than 10 mm and particularly preferably less than 8 mm. For example, the lower limit of the distance can be at least 2 mm, especially at least 4 mm and further particularly at least 6 mm. Accordingly, a particularly compact illumination device is provided, which has a particularly low thickness.

In particular, the segments can have a triangular, rectangular, pentagonal, hexagonal or other polygonal shape. The shape refers in particular to the cross-section of the segment or the shape is visible in the top view of the segment on the reflector element. Accordingly, areas on the optical pane can be illuminated that take on a corresponding shape of the segments, i.e., a triangular light shape, a rectangular light shape, a pentagonal light shape or a hexagonal light shape. This allows for different light signatures to be displayed by illuminating multiple segments by means of the illumination device. Especially in the case of triangular segments, a particularly high degree of freedom of control for different light signatures is possible.

In a triangular segment, for example, each segment has three reflector surfaces or reflector walls that are connected to each other on their sides. In the middle, the segments can have two openings each. An opening is close to the light emitting diode assigned the segment in order to let the light from the light emitting diode shine in. The other opening is close to the optical pane or away from the light emitting diode in order to let the light reflected at the reflector surfaces of the segments of the reflector element shine onto the optical pane. In particular, the opening close to the light emitting diode is smaller than the opening close to the optical disk. Accordingly, tapered or converging segments can be provided, especially in the direction of the optical pane to the light emitting diodes. The segments can therefore also be described as funnel-shaped or pyramid-shaped with corresponding openings at the top and bottom of the pyramid shape in terms of their body or volume.

If, for example, the segments are triangular, each segment has three reflector surfaces or reflector walls that are connected to each other on their sides. With a different shape, correspondingly more reflector surfaces can form the segment. In the middle, the segments can each have two openings. An opening is close to the light emitting diode assigned the segment in order to let the light from the light emitting diode shine in. The other opening is close to the optical pane or away from the light emitting diode in order to let the light reflected at the reflector surfaces of the segments of the reflector element radiate onto the optical pane. In particular, the opening close to the light emitting diode is smaller than the opening close to the optical pane. Accordingly, tapered or converging segments can be provided, especially in the direction of the optical pane to the light emitting diodes. The segments can therefore also be described as funnel-shaped or pyramid-shaped with corresponding openings at the top and bottom of the pyramid shape in terms of their body or volume.

Several segments can be combined to form a row- and column-by-column arrangement at the reflector element. The repetitive arrangements of the segments with their respective shapes allow for a particularly versatile design and display of different light signatures. In particular, the arrangements may have a form corresponding to the segments or to the segments, which means, in particular, that a plurality of segments may be combined into a new shape, particularly different from the shape of the segments. For example, the arrangements can each have a rectangular shape or honeycomb shape. In particular, the arrangements can be rectangular, especially square, with a triangular shape of the segments and honeycomb with a hexagonal shape of the segments. For example, four triangular segments can be combined into a rectangular shape. Accordingly, the light emitting diodes on the printed circuit board can also be arranged accordingly. For example, the printed circuit board can have a repeating pattern of an arrangement of four light emitting diodes each. For example, the arrangement can be described as a plus or +arrangement, in which four light emitting diodes can be connected to each other by two imaginary lines, each of which connects and intersects two light emitting diodes horizontally and vertically.

In addition, the illumination device may have a grating mask (with a grating or with grating struts) that (visually) demarcate the segments from each other. In particular, the grating mask is opaque (in the area of its grating or grating struts). For example, the grating mask can be black. Accordingly, the grating struts or the grating of the grating mask ensure that the segments are separated from each other in the cold and warm appearance of the illumination device in order to improve the visual perception of the displayable light signatures.

In particular, the grating mask can be designed as a sheet metal, a foil, an injection molding part and/or a laser ablation of the optical pane. In particular, a thin sheet can be used as a sheet metal, for example with a wall thickness between 0.1 mm and 0.5 mm, which can be lasered for the creation of openings in the area of the segments. The sheet metal can then be clamped between the optical pane and a housing frame or housing of the illumination device in the assembly or glued onto the optical pane or into the housing frame. The foil can be printed or glued, for example. The foil or adhesive foil can be printed with the grating or grating struts and glued to the optical pane or clamped between the optical pane and the housing frame in the assembly. In particular, a 2-component molded part can be used as an injection-molded part. For example, the grating mask can be injected onto the optical pane as a second, black component. In the case of laser ablation, for example, the optical pane can be metallized or painted and then laser-cut for the open segment surfaces.

The illumination device may also have a housing, in particular as a housing frame or with a housing frame. The housing can contain the printed circuit board, the reflector element and the optical pane. Furthermore, the grating mask can also be included in the housing.

Fastening elements, such as screw bosses, can be arranged at the back of the housing.

In addition, it may be provided that the optical pane has optical scattering elements on its front and/or back. For example, pillow optics or micro-optics can be provided as optical scattering elements, or a diffractive diffuser structure or microstructure or, in the simplest case, an EDM structure or etching structure.

It is also possible that the segments have strip optics or that strip optics are formed in the segments. A stripe optic can be provided on each surface or reflector wall of the segment or reflector element. The strip optics, which can also be referred to as ripple optics, can scatter the direct surface reflection of the light emitting diode light and thus counteract a concentrated image of the light in the illumination in order to avoid hotspots.

According to a second aspect of the invention, the object mentioned above is achieved by an illumination system for a motor vehicle having an illumination device according to the first aspect of the invention and a control unit for controlling a light signature display of the illumination device.

In particular, the illumination device can be variably controlled via the control unit or the electronics in order to display a wide variety of contents, such as individual pictograms and signs, such as traffic signs, or traffic aid signs, such as a right-pointing arrow, an indicator arrow, an image of a pedestrian or the like. Such content, which can be represented by means of appropriate illumination by several of the light emitting diodes or segments, are understood herein as light signatures. Such light signatures can be static or dynamic, i.e., they do not change over time or they do change over time.

In particular, the illumination system may have several illumination devices according to the first aspect of the invention. The control unit can be set up to control at least two of the several illumination devices to display a common light signature.

In the present case, a common light signature is understood to mean that the light signature of at least two illumination devices are matched to each other in order to represent the same or a coordinated content by means of the illumination.

According to a third aspect of the invention, the object mentioned above is achieved by a motor vehicle having an illumination device according to the first aspect of the invention or an illumination system according to the second aspect of the invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
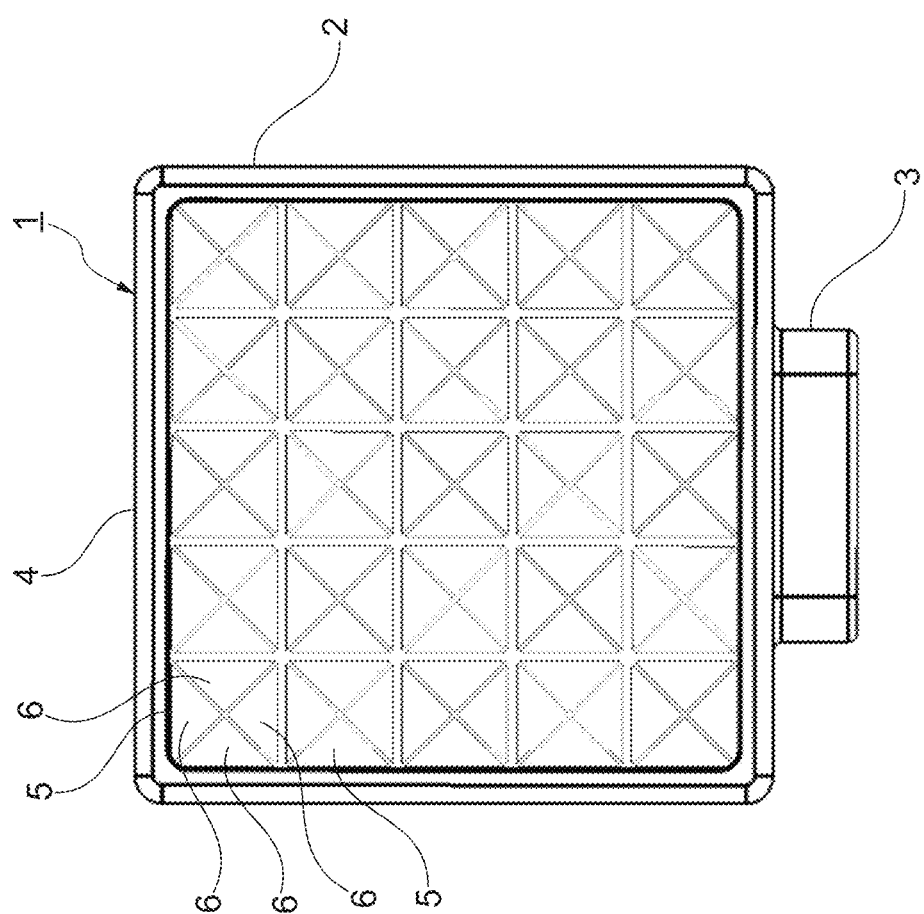
FIG. 1 shows a plan view of an illumination device according to an example of the invention.
Figure 2:
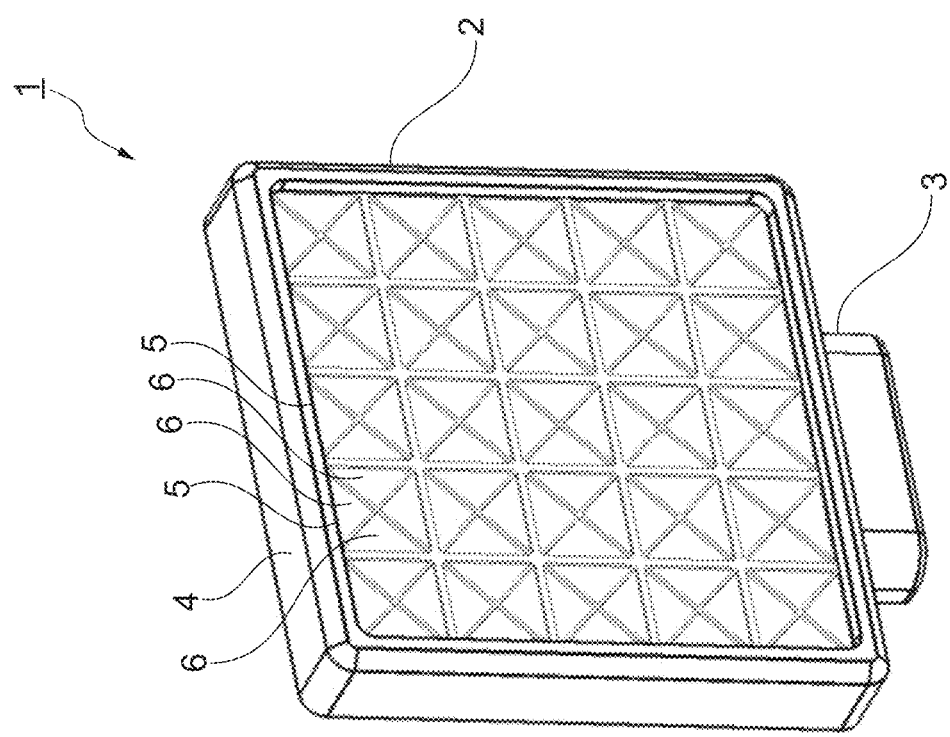
FIG. 2 shows an oblique view of the illumination device from FIG. 1.
Figure 3:
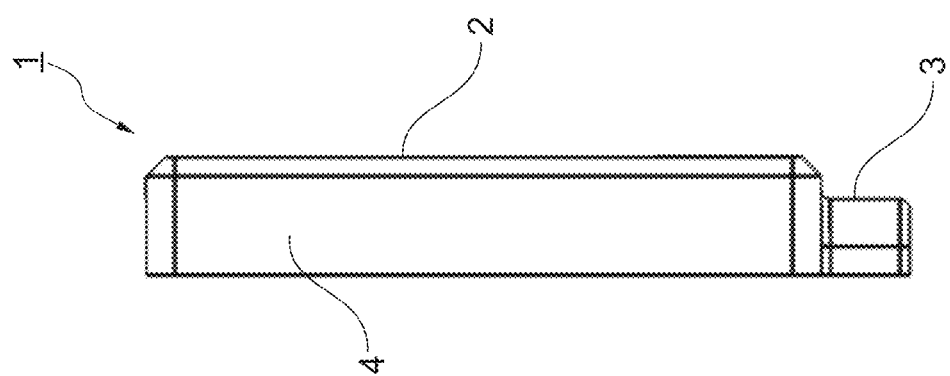
FIG. 3 shows a side view of the illumination device from FIG. 1.

FIGS. 1 to 3 each show an illumination device 1 according to an example of the invention in a plan view, a perspective view and a side view.

The illumination device 1 comprises a housing 4, which in the present case is designed as a housing frame with an upper part 2 and a lower part 3. The housing 4 has a thickness that is small compared to its width and height extension. In the present case, by way of example the housing 4 is rectangular, in particular square, so that the illumination device 1 has a rectangular shape as a whole, especially in the upper part 2. Alternatively, the housing 4 or the illumination device 1 may have other shapes, such as rectangular, round or oval.

As can be seen in FIG. 1, the illumination device 1 has several arrangements 5, each comprising a plurality of segments 6. In the present case, by way of example the arrangements 5 are square in their basic shape or appearance on the optical pane 8 (see FIG. 5) of the illumination device 1 and each comprise four triangular segments 6. The individual segments 6 can be individually and uniformly illuminated by means of light emitting diodes 11 (see FIG. 5) arranged behind them.

Figure 4:
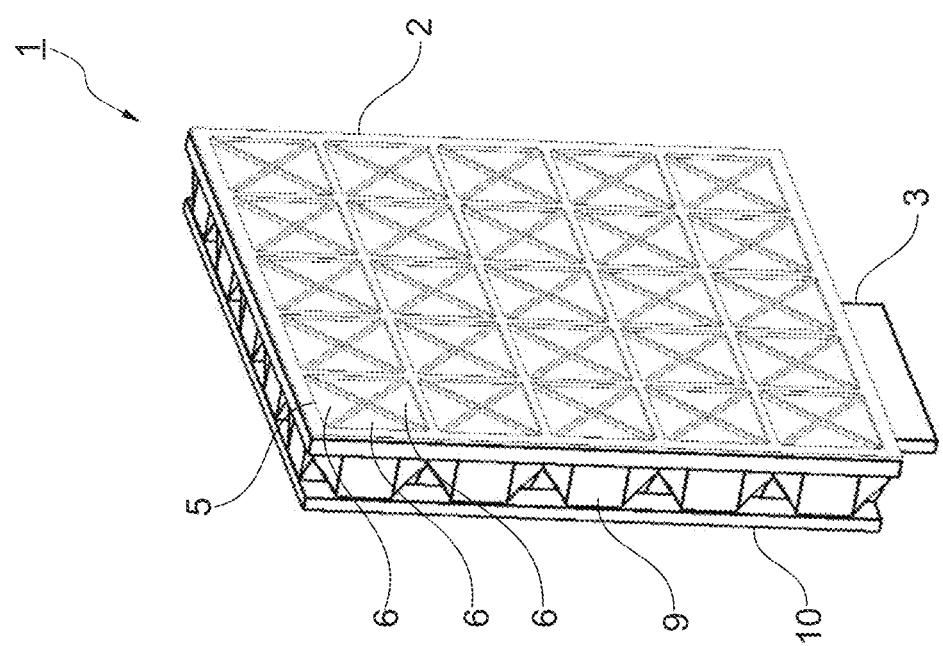
FIG. 4 shows the side view of the illumination device from FIG. 1 without a housing.

FIG. 4 shows in a perspective view of the illumination device 1 without housing 4 that for this purpose the light emitting diodes 11 (see FIG. 5) are arranged on a printed circuit board 10 or plate 5 and behind a reflector element 9.

Figure 5:
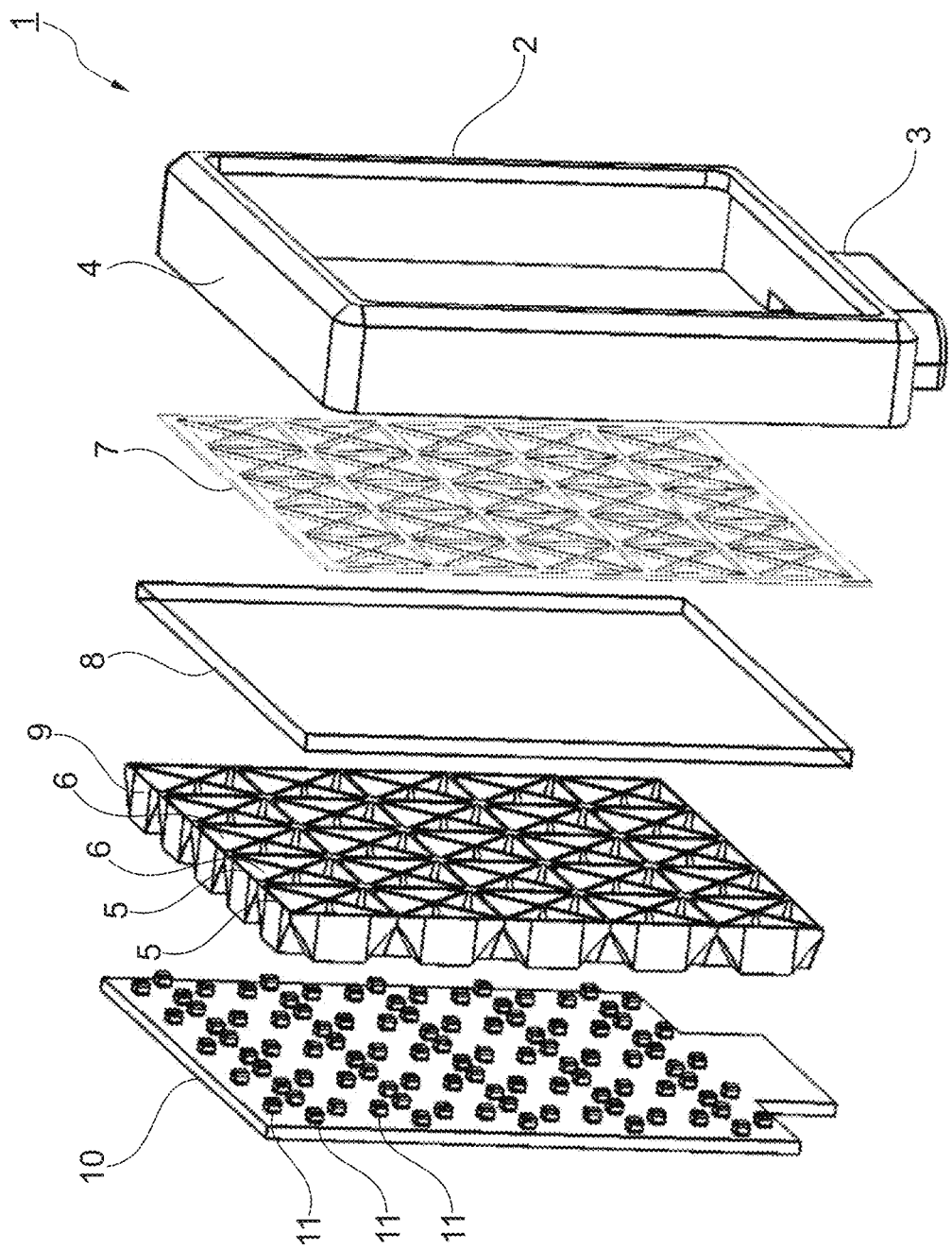
FIG. 5 shows an exploded view of the illumination device from FIG. 1.

FIG. 5 shows an exploded view of the illumination device 1, from which it can be seen that the reflector element 9 has the segments 6 arranged in arrangements 5 and the repeating arrangements 5. In the present case, the reflector element 9 is arranged in a single piece with all arrangements 5 and segments 6. Alternatively, the segments 6 can also be manufactured individually, but this is more complex.

The reflector element 9 is arranged on the printed circuit board 10 with the light emitting diodes 11. Here, one light emitting diode 11 is assigned one segment 6 each in the reflector element 9 or one segment 6 surrounds one of the light emitting diodes 11 each on the printed circuit board 10.

On the reflector element 9, an optical pane 8, for example made of glass or plastic, is arranged. On the optical pane 8, on the other hand, there is a grating mask 7, which provides an optical separation of the segments 6 from each other. All of the above-mentioned components are included in the housing 4.

Figure 6:
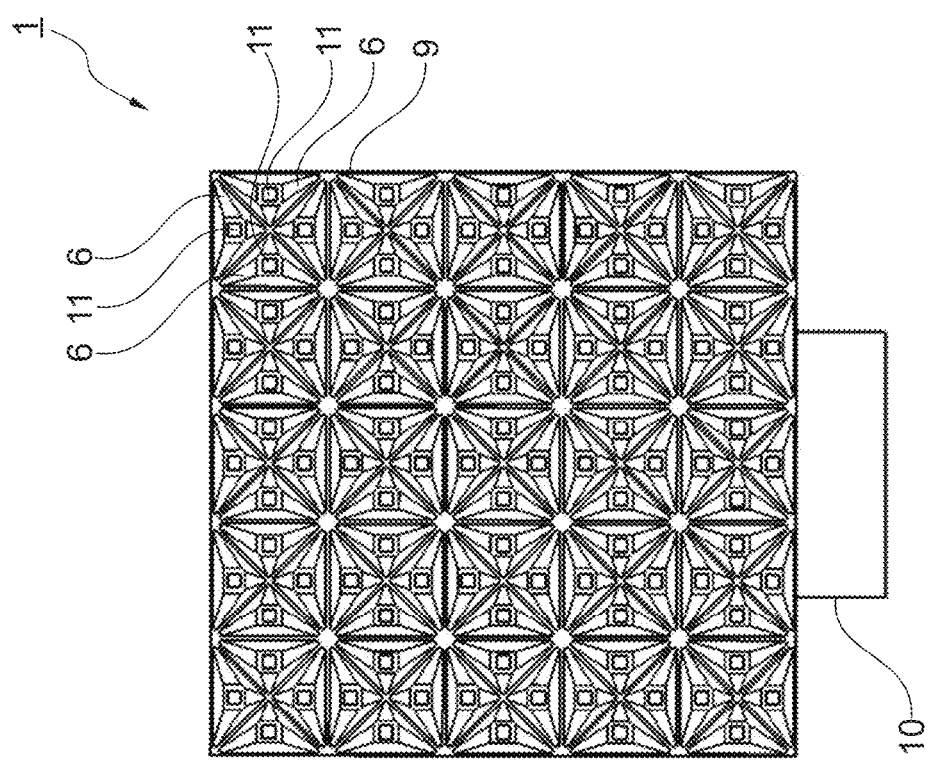
FIG. 6 shows a plan view of the illumination device from FIG. 1 without housing and without a grating mask.

FIG. 6 shows a plan view of the illumination device 1 without housing 4, without optical pane 8 and without grating mask 7. Here you can see well how each light emitting diode 11 is assigned one segment 6 in each case, which can illuminate the light emitting diode 11. Each of the light emitting diodes 11 is surrounded by a segment 6 of the reflector element 9, respectively.

Figure 7:
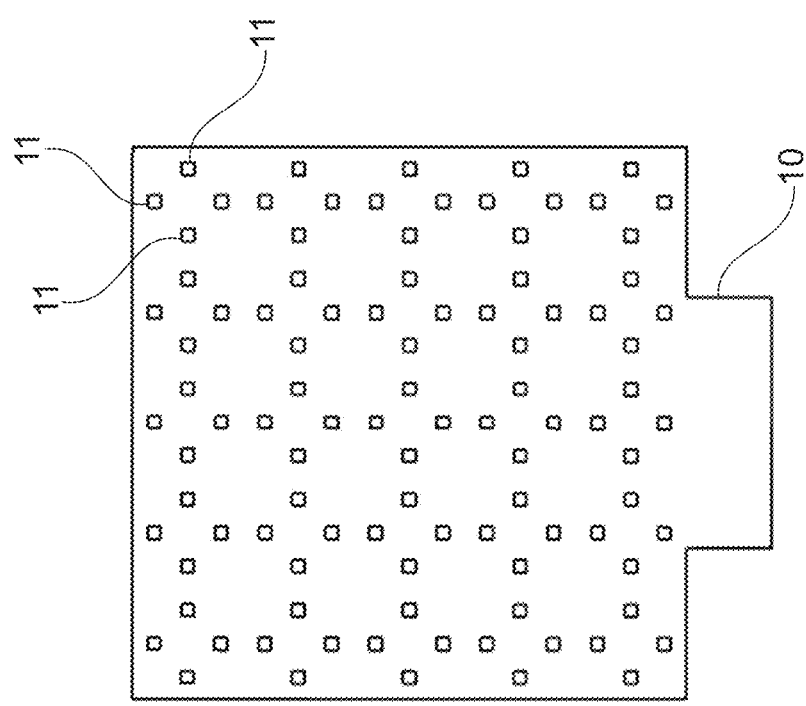
FIG. 7 shows a plan view of the printed circuit board of the illumination device from FIG. 5.

FIG. 7 shows a plan view of the printed circuit board 10 with the light emitting diodes 11. As can be seen, the light emitting diodes 11 are arranged here corresponding to the arrangements 5 on the printed circuit board 10.

Figure 8:
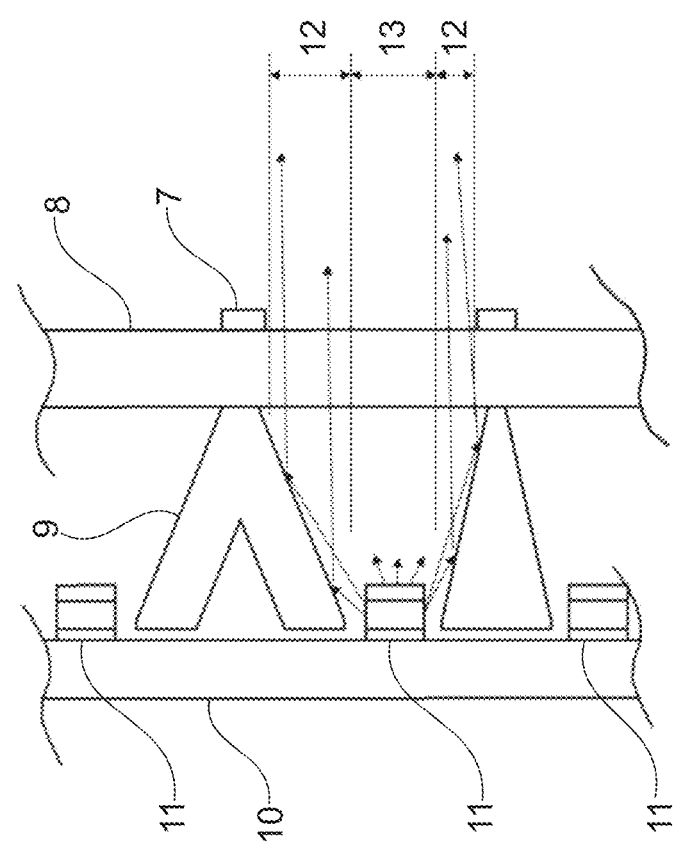
FIG. 8 shows a schematic view of a section of the illumination device from FIGS. 1 to 7 in operation.

FIG. 8 shows a section of the illumination device 1 in a cross-sectional view. Here you can see an example of a section of a printed circuit board 10 with three light emitting diodes 11 as well as a partial structure or wall elements of the reflector element 9. Finally, the grating mask 7 is located behind the optical pane 8.

The distance between the light emitting diodes 11 and the optical pane 8 is particularly small, for example only 10 cm or less, in order to achieve the compactness or low thickness of the illumination device 1 mentioned above. Accordingly, there is little space for the corresponding reflector element 9 or corresponding reflections. At the same time, however, it is necessary to ensure that the illumination of the respective segment 6 or the area of the optical pane 8 in front of the respective segment 6 is as uniform as possible.

In order to ensure this, light emitting diodes 11 are used in the present case, which radiate in a radial or ring-shaped manner. These light emitting diodes 11 radiate light mainly from their circumference, as can be seen from FIG. 8. They can emit the light along their entire circumference or by 360°. This provides a short path to the reflector element 9, which is set up in such a way that it deflects the light from the light emitting diodes 11 onto the optical pane 8 in front of the segments 6. This is shown in FIG. 8 by the first area 12 of the light beams.

Together with a possible small proportion of light, which is emitted directly from the front of the light emitting diodes 11 onto the optical pane 8, a particularly uniform illumination of the individual segments 6 or the optical pane 8 in the area in front of the segments 6 is possible. The light beams passing directly through the optical pane 8 from the light emitting diode 11 are represented by the second area 13.

Figure 9:
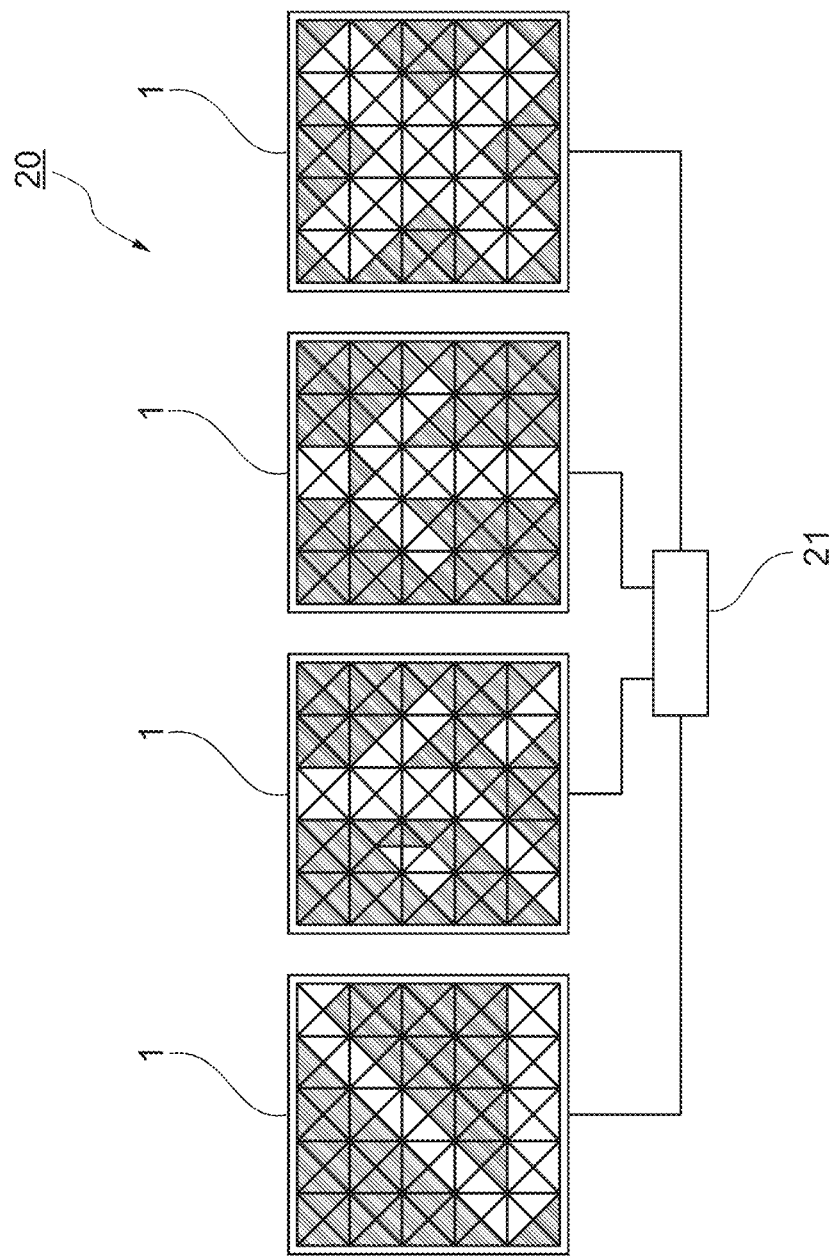
FIG. 9 shows a schematic view of an illumination system according to an example of the invention in operation with different light signatures.

FIG. 9 schematically shows an illumination system 20 with a plurality of, in the present case only four, illumination devices 1. The illumination devices 1 can be controlled by means of individual control units or as shown, by a common control unit 21.

FIG. 9 shows different light signatures displayed by the respective illumination devices 1. Individual contents or symbols are reproduced by means of the light signatures, such as a cross for a stop, a walking pedestrian or a standing pedestrian.

When using light emitting diodes 11 covering the color spectrum (yellow, red, blue), it is also possible to split the surface of an illumination device 1, for example with a larger red area (red light emitting diodes) and a smaller yellow area (yellow light emitting diodes) or a different color division. As a result, two functions, e.g., tail light and direction indicator, or three functions, e.g., tail brake light and direction indicator, can also be realized.

Figure 10:
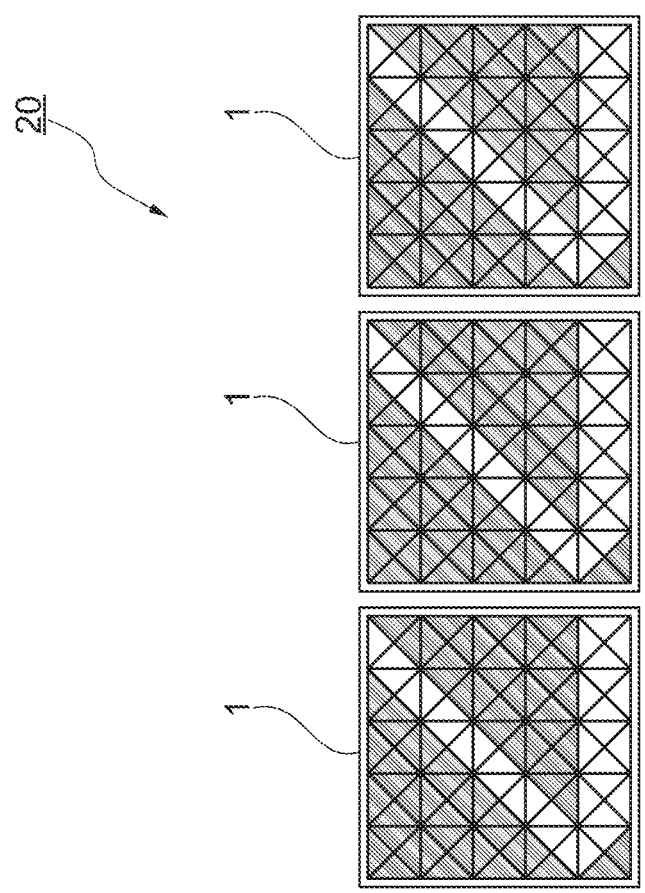
FIG. 10 shows a schematic view of an illumination system according to another example of the invention in operation with a common light signature.

However, it is also possible to match the light signatures of the individual illumination devices 1. For example, FIG. 10 shows three illumination devices 1 of an illumination system 20, each of which shows the same light signature.

Figure 11:
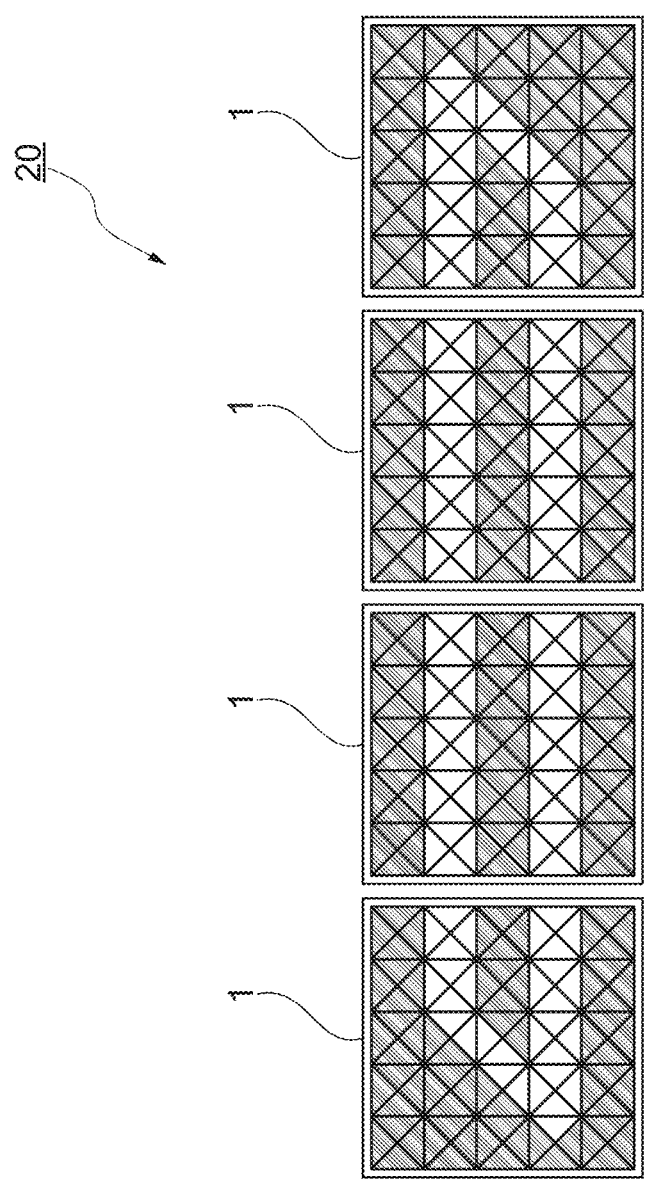
FIG. 11 shows a schematic view of the illumination system from FIG. 9 in operation with a common light signature.
Figure 12:
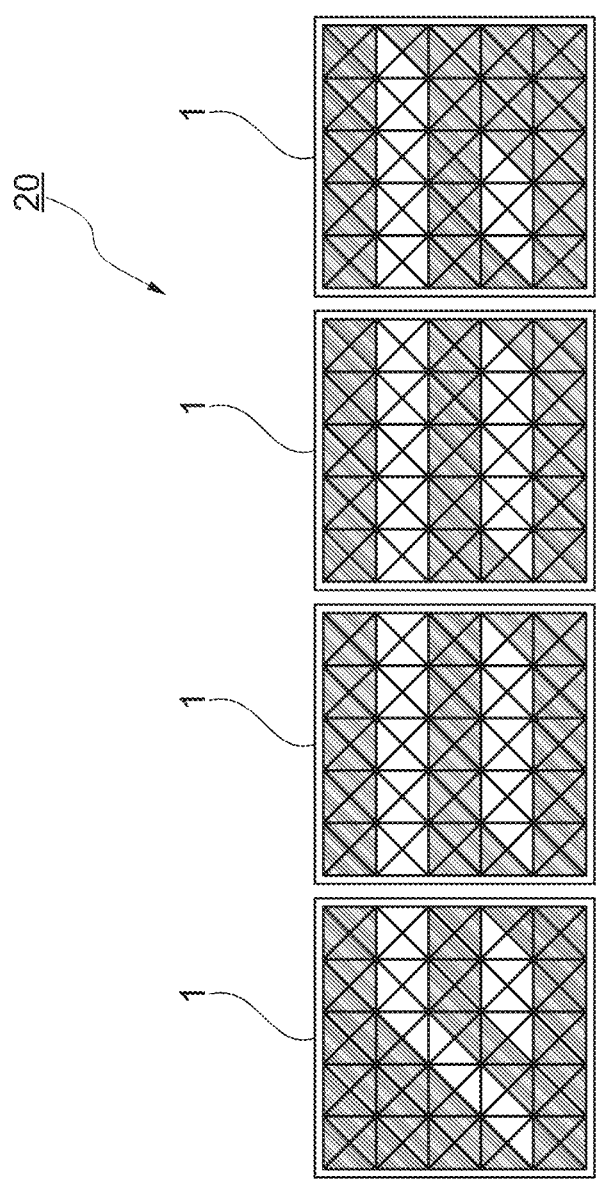
FIG. 12 shows a schematic view of the illumination system from FIG. 9 in operation with another common light signature.

FIGS. 11 and 12 each show a different and self-contained or common light signature, which is produced by them together when four illumination devices 1 are lined up or connected in series.

Figure 13:
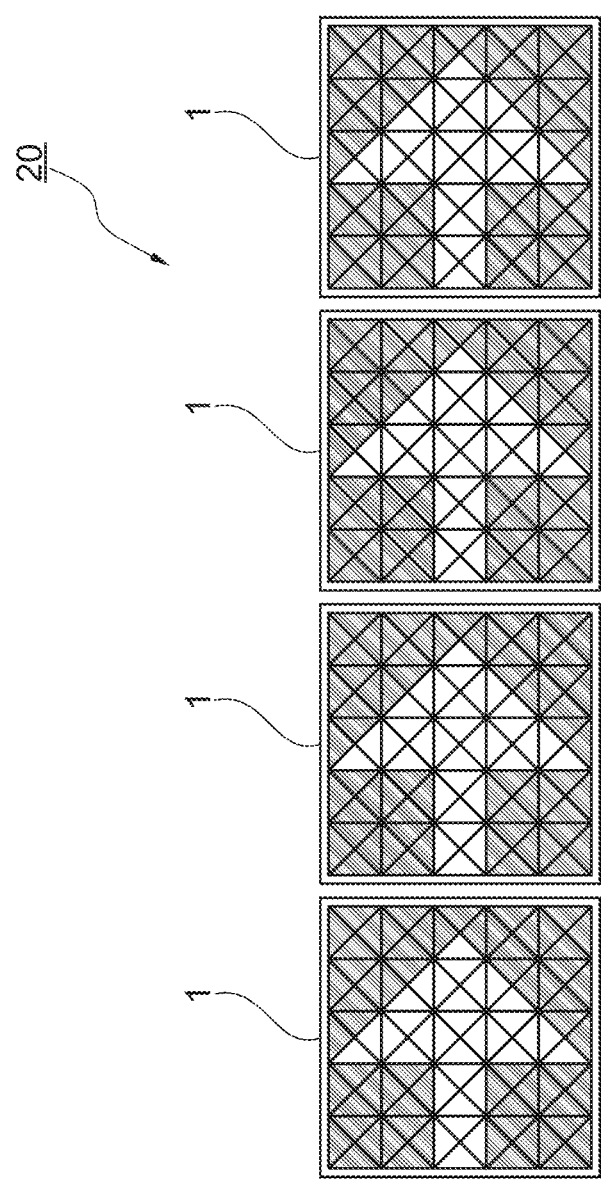
FIG. 13 shows a schematic view of the illumination system from FIG. 9 in operation with yet another common light signature.

FIG. 13, on the other hand, shows a repetition of a light signature on four illumination devices 1 of an illumination system 20, in which the light signature has an indicator function that can be used, for example, when driving the motor vehicle 30 equipped with the illumination system 20, namely the display of a right-pointing arrow, which can also be referred to as a driving indicator and can be used, for example, to drive the motor vehicle 30 equipped with it (see FIG. 14) to the right.

Figure 14:
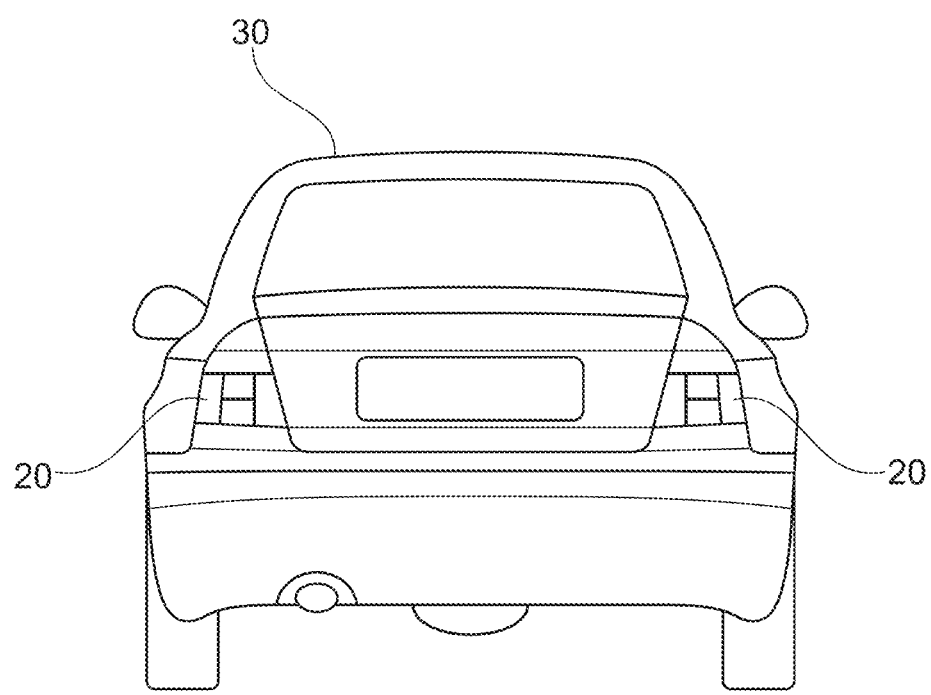
FIG. 14 shows a rear view of a motor vehicle according to an example of the invention.

FIG. 14 shows a motor vehicle 30 according to an example of the invention in a rear view. The motor vehicle 30 is designed with the illumination systems 20 described above, which in the present case are designed as rear lights of the motor vehicle 30 and thus enable the display of various common or different light signatures, for example of a turn using corresponding arrow representations as light signatures.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An illumination device for a motor vehicle, the illumination device comprising:
   a printed circuit board;
   a plurality of light emitting diodes arranged on the printed circuit board;
   an optical pane;
   a reflector element arranged between the printed circuit board and the optical pane, the reflector element having a plurality of segments into which the reflector element is divided,
   wherein each light emitting diode is assigned a respective one of the segments so that light emitted from the light emitting diodes is reflected by reflective walls of the segments of the reflector element and passes through the optical pane, and
   wherein the light emitting diodes are radial-beam light emitting diodes and the reflective walls of the segments are each obliquely angled with respect to the printed circuit board.

2. The illumination device according to claim 1, wherein the radial-beam light emitting diodes are designed such that light radiates radially outwards at a circumference of each of the radial-beam light emitting diodes.

3. The illumination device according to claim 2, wherein the radial-beam light emitting diodes are designed such that the light radiates radially outwards at least over half of the circumference of each of the radial-beam light emitting diodes or substantially along an entirety of the circumference of each of the radial-beam light emitting diodes.

4. The illumination device according to claim 1, wherein each light emitting diode is assigned a respective one of the segments such that light emitted from each light emitting diode is reflected by the reflector element and passes through the optical pane in an area of the respective one of the segments assigned to each respective one of the light emitting diodes.

5. The illumination device according to claim 1, wherein a distance between the light emitting diodes and the optical pane is less than 15 mm.

6. The illumination device according to claim 1, wherein the segments have a triangular shape, a rectangular shape, a pentagonal shape, a hexagonal shape or other polygonal shape.

7. The illumination device according to claim 1, wherein the plurality of segments are grouped together to form repeating row- and column-by-column arrangements on the reflector element.

8. The illumination device according to claim 7, wherein the arrangements each have a corresponding form to the segments.

9. The illumination device according to claim 1, wherein the illumination device has a grating mask, which delimits the segments from each other.

10. The illumination device according to claim 9, wherein the grating mask is designed as a sheet metal, a foil, an injection molding part and/or a laser ablation of the optical pane.

11. The illumination device according to claim 1, wherein the illumination device also has a housing in which the printed circuit board, the reflector element and the optical pane are included.

12. The illumination device according to claim 1, wherein a front and/or a back of the optical pane has optical scattering elements thereon.

13. An illumination system for a motor vehicle, the illumination system comprising an illumination device according to claim 1 and a control unit to control a light signature display of the illumination device.

14. The illumination system according to claim 13, wherein the illumination system further comprises a plurality of illumination devices and wherein the control unit is set up to control at least two of the plurality of illumination devices to display a common light signature.

15. A motor vehicle comprising an illumination device according to claim 1.

* * * * *